US010715176B1

(12) United States Patent
Singh et al.

(10) Patent No.: US 10,715,176 B1
(45) Date of Patent: Jul. 14, 2020

(54) RECOMMENDING DATA COMPRESSION SCHEME USING MACHINE LEARNING AND STATISTICAL ATTRIBUTES OF THE DATA

(71) Applicant: EMC IP Holding Company LLC, Hopkinton, MA (US)

(72) Inventors: Sweetesh Singh, Benares (IN); Jonathan I. Krasner, Coventry, RI (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/384,869

(22) Filed: Apr. 15, 2019

(51) Int. Cl.
*H03M 7/00* (2006.01)
*H03M 7/30* (2006.01)
*G06N 20/00* (2019.01)
*G06N 3/08* (2006.01)
*G06F 17/18* (2006.01)

(52) U.S. Cl.
CPC .......... *H03M 7/6064* (2013.01); *G06F 17/18* (2013.01); *G06N 3/08* (2013.01); *G06N 20/00* (2019.01)

(58) Field of Classification Search
CPC ...... H03M 7/6064; G06F 17/18; G06N 20/20; G06N 3/08

USPC ...................................................... 341/50, 51
See application file for complete search history.

(56) References Cited

U.S. PATENT DOCUMENTS

| 7,596,587 B2 * | 9/2009 | Berkhin | ................ G06F 3/0685 |
| 8,817,094 B1 * | 8/2014 | Brown | .................... H04N 7/188 |
| | | | 348/143 |
| 2019/0081637 A1 * | 3/2019 | Pool | .................... H03M 7/3059 |
| 2019/0287024 A1 * | 9/2019 | Briggs | ................... G06N 20/20 |

\* cited by examiner

*Primary Examiner* — Peguy Jean Pierre
(74) *Attorney, Agent, or Firm* — Amin, Turocy & Watson, LLP (57) ABSTRACT

Described herein is a system that facilitates recommending data compression using machine learning and statistical attributes. According to an embodiment, a system can comprise receiving a dataset, statistical attributes associated with the dataset, and a compression requirement for compression of the dataset. The system can further comprise based on the statistical attributes and the compression requirement, estimating a first compression attribute and a second compression attribute of a group of compression processes. The system can further comprise selecting a primary compression process from the group of compression processes, based on an output of an analytics component, wherein the analytics component employs a neural network to determine the primary compression process based on analysis of the statistical attributes, the compression requirement, and a compression objective.

20 Claims, 10 Drawing Sheets

RECOMMENDING DATA COMPRESSION SCHEME USING MACHINE LEARNING AND STATISTICAL ATTRIBUTES OF THE DATA

TECHNICAL FIELD

The subject disclosure relates generally to compression of data, and more particularly, this disclosure relates to various embodiments for facilitating recommending data compression algorithms using machine learning and statistical attributes of the data.

BACKGROUND

Data compression is a way of information encoding which results in storage saving. Storage servers generally deploy various lossless compressions (original information can be exactly reconstructed) for storage space reduction. All these algorithms behave substantially different from one another in terms of compression ratio or time to compress/decompress on different datasets. Accordingly, no compression algorithm can compress every input file in same manner with same results. Depending on the dataset attributes, some compression algorithms are faster and realize a small storage savings, while other compression algorithms are slower but provide a greater storage saving.

The above-described background relating data compression is merely intended to provide a contextual overview of some current issues and is not intended to be exhaustive. Other contextual information may become further apparent upon review of the following detailed description.

BRIEF DESCRIPTION OF DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

The following detailed description is merely illustrative and is not intended to limit embodiments and/or applications or uses of embodiments. Furthermore, there is no intention to be bound by any expressed or implied information presented in the preceding Summary section, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident; however, in various cases, that one or more embodiments can be practiced without these specific details.

In several embodiments disclosed herein describes an approach of using machine learning to identify the hidden relationship between statistical attributes of the data and behavior of different compression algorithm on the same dataset. There can be many statistical features such as size, entropy, chi square test, Pearson correlation coefficient which will inform behavior of compression algorithms on it i.e. size of the output compressed data, time for compression or time for decompression. Such relationships will play very important role in determining/recommending the appropriate compression algorithms, such as if highest space saving is the objective then the machine learning model for compressed data size should be used. In other settings, objective can be changed to time for compression or decompression. Such machine learning model will also inform which statistical characteristics are more influential for which objective. Hence knowledge of source and statistical distribution of the data, can be used to recommend compression algorithm.

According to several embodiments, the functioning of multi-objective machine learning model which takes input as statistical attributes of the data and reports accurately the output size, time consumption that would be observed if different compression algorithms were applied on it are described. In order to recommend the best algorithm for a dataset, only few statistical features such as size, entropy, chi-square test, arithmetic mean, serial correlation coefficient would be given as input to learning model which will produce an output, informing the size of compressed data or time required for the operation. Depending on the requirement, optimal in terms of both can be recommended. If the model gets trained on reasonable number of decompression data or lossy compression or memory overhead data, it would predict the behavior in context of decompression or lossy compression, memory need (or any other resource such as compression rate). Analysis of these learning models also informs which statistical attributes have more weight for different algorithms, such analysis gives a hint or informs some simple mathematical operations which can be performed for quick assessment of compression algorithm determination/recommendation. In general, a source of data maintains the statistical distribution through which dataset is produced which implies, till the same distribution or source is maintained, we can recommend the same algorithm without going through the machine learning cycle.

These and other embodiments or implementations are described in more detail below with reference to the drawings.

Figure 1:
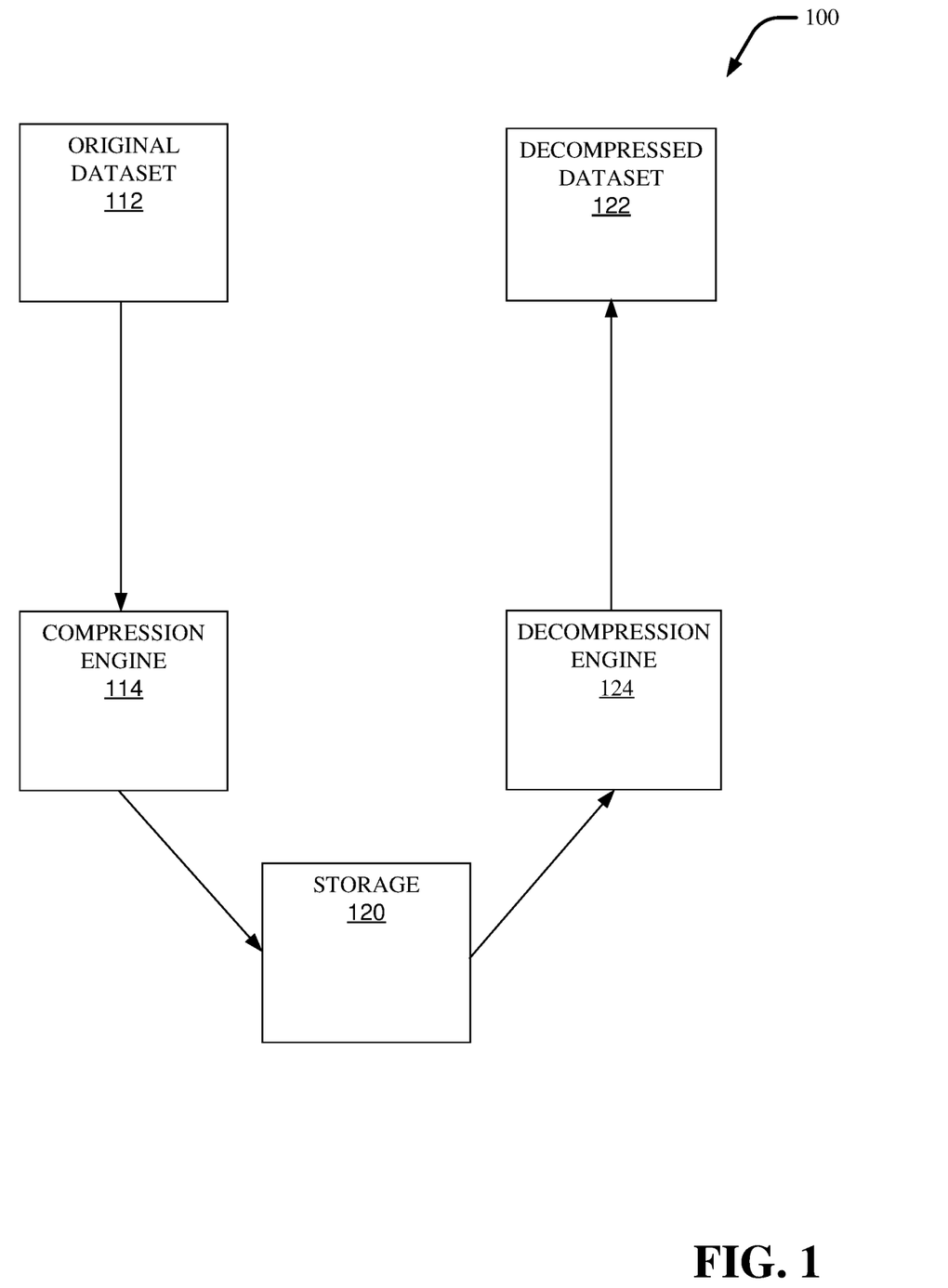
FIG. 1 illustrates an example of non-limiting data compression system employed to facilitate data compression of dataset in accordance with one or more embodiments described herein.

FIG. 1 illustrates an example of non-limiting data compression system 100 employed to facilitate data compression of dataset in accordance with one or more embodiments described herein. Repetitive description of like elements employed in respective embodiments is omitted for sake of brevity. According to some embodiments, the data compression system 100 can comprises an original dataset 112 that requires compression. The original dataset 112 is provided to a compression engine 114. The compression engine 114 can analyze the dataset to determine various attributes (e.g., size of the data set, whether the dataset is organized by clusters, type of dataset, etc.). The compression engine 114 can further evaluate one or more available compression algorithms to estimate time for compression/decompression and size of the compressed dataset for each available algorithm. The compression engine can utilize a neural network or linear regression to identify a compression algorithm to use based on various factors, including but not limited to, compression requirement and compression objectives (e.g., size and compression/decompression time objectives). In some embodiments, the compression engine 114 can select a compression algorithm for recommendation. The dataset is compressed and stored at a storage 120 upon user/requestor selecting the recommended compression algorithm. In some embodiments, the compression engine tracks whether the recommended algorithm was utilized, or another compression algorithm used instead. The selection information is provided to a neural network to improve future recommendation. In some embodiments, the compressed dataset is decompressed by a decompression engine 124. In some embodiments, a decompression algorithm associated with the compression algorithm is utilized to decompress the dataset. In some embodiments, a decompressed dataset 122 is a restored copy of the original dataset 112 (e.g., based on lossless compression algorithm). In some embodiments, depending on the compression objectives, the decompressed dataset 122 may not be restored in the original form (e.g., lossy compression algorithm).

Figure 2:
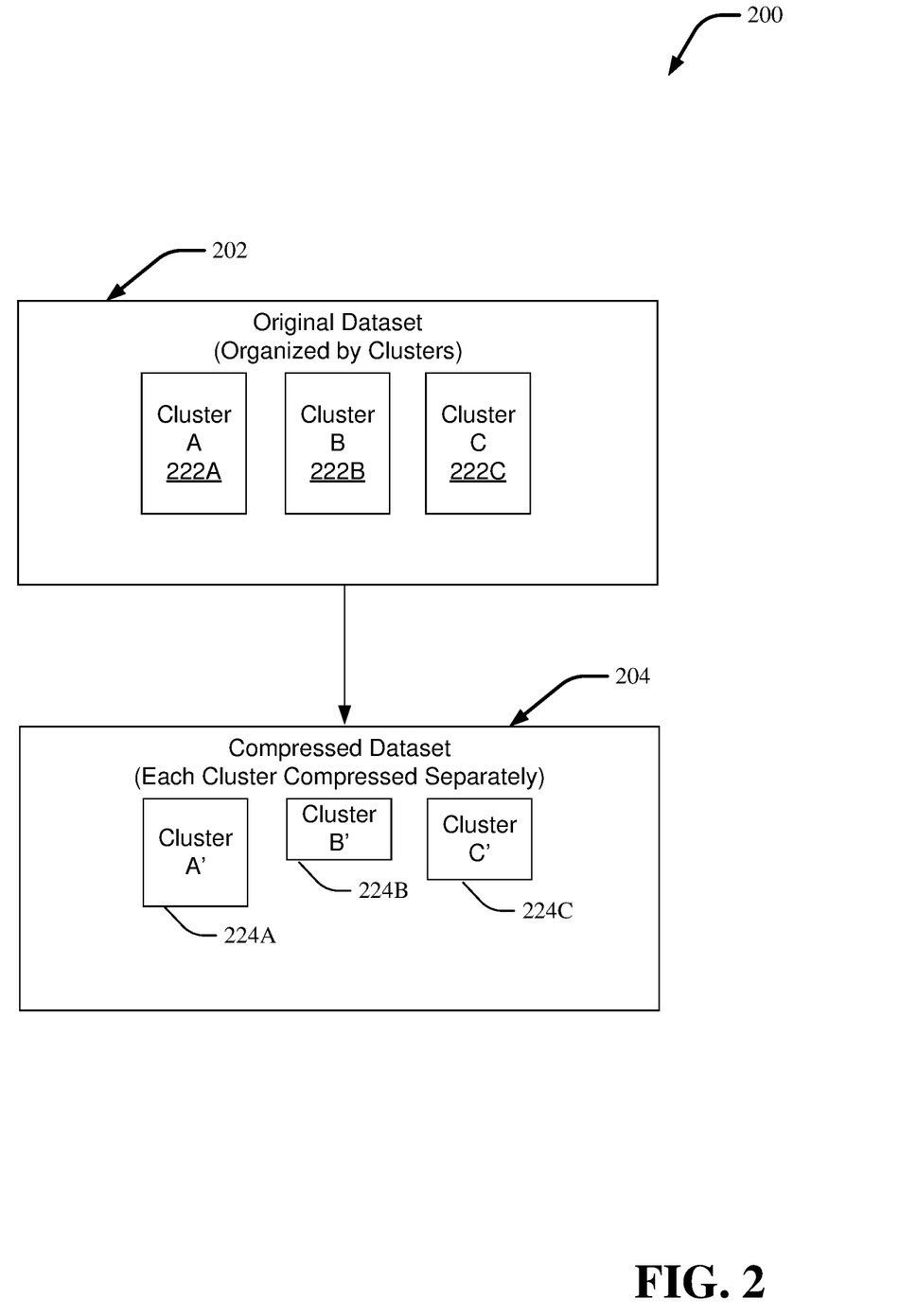
FIG. 2 illustrates an example of non-limiting data compression system in accordance with one or more embodiments described herein.

FIG. 2 illustrates an example of non-limiting data compression system 200 in accordance with one or more embodiments described herein. Repetitive description of like elements employed in respective embodiments is omitted for sake of brevity. According to some embodiments, an original dataset 202 is organized by data clusters (e.g., a cluster A 222A, a cluster B 222B and a cluster C 222C, also referred to as "clusters" 222), wherein the data is grouped into one or more clusters 222. In some embodiments, the compression engine 104 (e.g., FIG. 1) may employ different compression algorithm for each cluster. In some embodiments, same compression algorithm is employed for compressing the clusters 222. For example, the cluster A 222A may be compressed using compression algorithm A, the cluster B 222B may be compressed using compression algorithm B, and the cluster C 222C may be compressed using compression algorithm C. In some embodiments, when the dataset 202 is compressed (e.g., compressed dataset 204), the clusters 222 will be compressed individually forming a compressed cluster A' 224A, a compressed cluster B' 224B and a compressed cluster C' 224C (refereed herein as "compressed clusters" 224). Depending the clusters attributes and the compression algorithm used, the compressed clusters 224 can realize different storage saving. For example, the compressed cluster A' 224A may be of different storage size than the compressed cluster B' 224B.

In some embodiments, the compression engine 104 may compress the clusters 222 individually or in parallel. If the compression engine 104 compresses the clusters 222 individually, the cluster (e.g., cluster C 222C) that is not being compressed can be modified or accessed. The advantage is that when the dataset is large, a portion of the dataset (e.g., individual cluster A 222A compressed separately) can be compressed while another portion (e.g., cluster B 222B and cluster C 222C) can be accessed or modified. When the dataset is not organized by clusters, generally, dataset cannot be accessed until the compression is complete.

Figure 3:
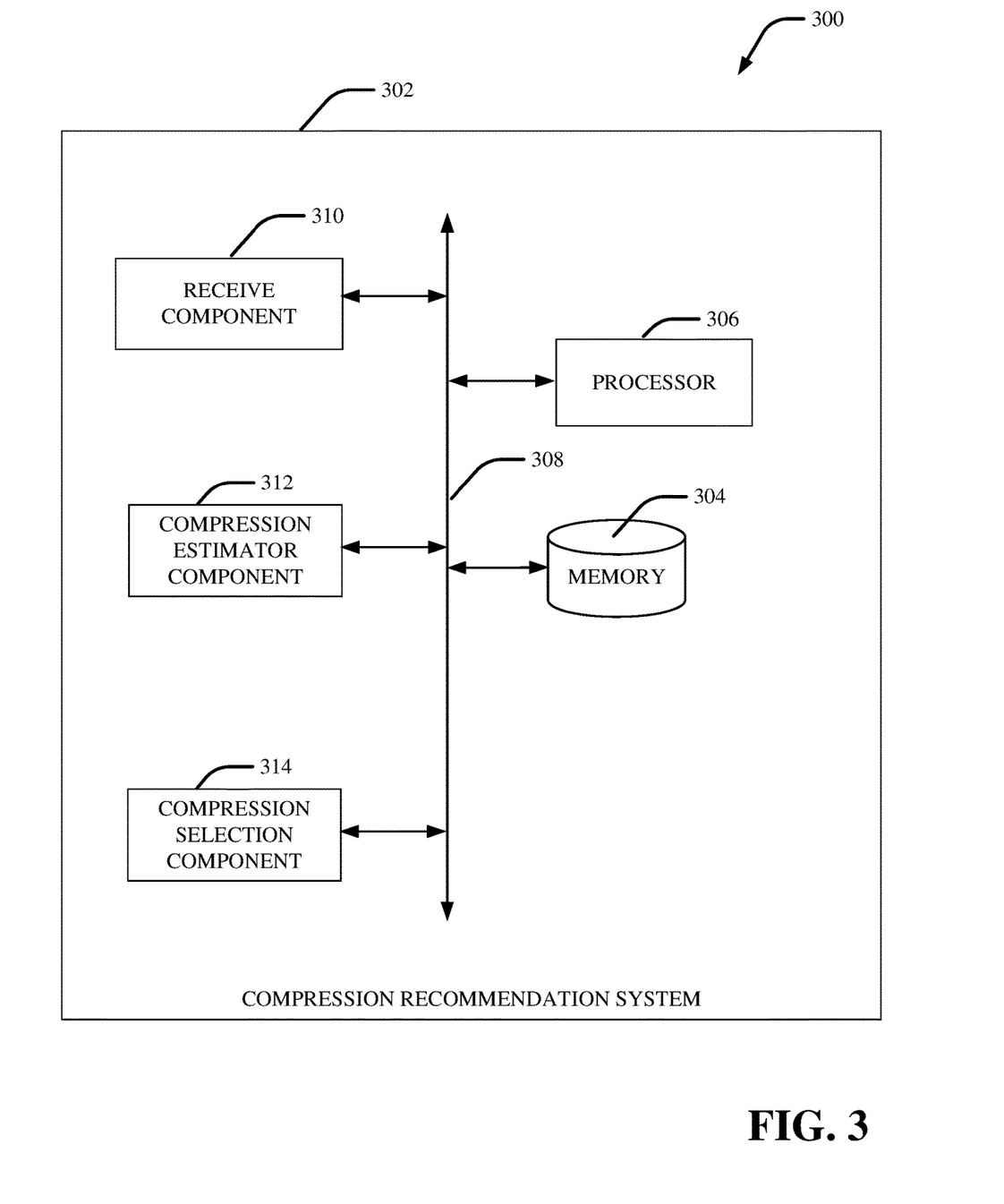
FIG. 3 illustrates a block diagram of an example, non-limiting system that facilitates recommending data compression using machine learning and statistical attributes in accordance with one or more embodiments described herein.

FIG. 3 illustrates a block diagram of an example, non-limiting system 300 that facilitates recommending data compression using machine learning and statistical attributes in accordance with one or more embodiments described herein. Repetitive description of like elements employed in respective embodiments is omitted for sake of brevity. According to some embodiments, the compression recommendation system 302 can include or otherwise be associated with a memory 304, a controller component 306 (also referred to as a "processor") that executes computer executable components stored in a memory 304. The compression recommendation system 302 can further include a system bus 308 that can couple various components including, but not limited to, a receive component 310, a compression estimator component 312 and a compression selection component 314.

Aspects of systems (e.g., the compression recommendation system 302 and the like), apparatuses, or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described.

It should be appreciated that the embodiments of the subject disclosure depicted in various figures disclosed herein are for illustration only, and as such, the architecture of such embodiments are not limited to the systems, devices, and/or components depicted therein. For example, in some embodiments, the compression recommendation system 302 can comprise various computer and/or computing-based elements described herein with reference to operating environment 1000 and FIG. 10. In several embodiments, such computer and/or computing-based elements can be used in connection with implementing one or more of the systems, devices, and/or components shown and described in connection with FIG. 3 or other figures disclosed herein.

According to several embodiments, the memory 304 can store one or more computer and/or machine readable, writable, and/or executable components and/or instructions that, when executed by controller component 306, can facilitate performance of operations defined by the executable component(s) and/or instruction(s). For example, the memory 304 can store computer and/or machine readable, writable, and/or executable components and/or instructions that, when executed by the controller component 306, can facilitate execution of the various functions described herein relating to the receive component 310, the compression estimator component 312 and the compression selection component 314.

In several embodiments, the memory 304 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Further examples of memory 304 are described below with reference to system memory 1016 and FIG. 10. Such examples of memory 304 can be employed to implement any embodiments of the subject disclosure.

According to some embodiments, the controller component 306 can comprise one or more types of processors and/or electronic circuitry that can implement one or more computer and/or machine readable, writable, and/or executable components and/or instructions that can be stored on the memory 304. For example, the controller component 306 can perform various operations that can be specified by such computer and/or machine readable, writable, and/or executable components and/or instructions including, but not limited to, logic, control, input/output (I/O), arithmetic, and/or the like. In some embodiments, controller component 306 can comprise one or more central processing unit, multi-core processor, microprocessor, dual microprocessors, microcontroller, System on a Chip (SOC), array processor, vector processor, and/or another type of processor.

In some embodiments, the components of compression recommendation system 302, for example, the controller component 306, the memory 304, the receive component 310, the compression estimator component 312 and the compression selection component 314 can be communicatively, electrically, and/or operatively coupled to one another via the system bus 308 to perform functions of the compression recommendation system 302, and/or any components coupled therewith. In several embodiments, the system bus 308 can comprise one or more memory bus, memory controller, peripheral bus, external bus, local bus, and/or another type of bus that can employ various bus architectures. Further examples of the system bus 308 are described below with reference to a system bus 1018 and FIG. 10. Such examples of system bus 308 can be employed to implement any embodiments of the subject disclosure.

In several embodiments, the compression recommendation system 302 can comprise one or more computer and/or machine readable, writable, and/or executable components and/or instructions that, when executed by the controller component 306, can facilitate performance of operations defined by such component(s) and/or instruction(s). Further, in numerous embodiments, any component associated with the compression recommendation system 302, as described herein with or without reference to the various figures of the subject disclosure, can comprise one or more computer and/or machine readable, writable, and/or executable components and/or instructions that, when executed by the controller component 306, can facilitate performance of operations defined by such component(s) and/or instruction(s). For example, the receive component 310, and/or any other components associated with the compression recommendation system 302 (e.g., communicatively, electronically, and/or operatively coupled with and/or employed by compression recommendation system 302), can comprise such computer and/or machine readable, writable, and/or executable component(s) and/or instruction(s). Consequently, according to numerous embodiments, the compression recommendation system 302 and/or any components associated therewith, can employ the controller component 306 to execute such computer and/or machine readable, writable, and/or executable component(s) and/or instruction(s) to facilitate performance of one or more operations described herein with reference to the compression recommendation system 302 and/or any such components associated therewith.

In some embodiments, the compression recommendation system 302 can facilitate performance of operations related to and/or executed by the components of compression recommendation system 302, for example, the controller component 306, the memory 304, the receive component 310, the compression estimator component 312 and the compression selection component 314. For example, as described in detail below, the compression recommendation system 302 can facilitate: receiving, by a system comprising a processor and a memory (e.g., the receive component 310), a dataset (e.g., databases, emails, spreadsheets, office documents, source codes etc. that may be organized by clusters), statistical attributes associated with the dataset, and a compression requirement for compressing the dataset; based on the statistical attributes and the compression requirement, estimating, by the system (e.g., the compression estimator component 312), a storage size attribute and a first-time attribute associated with group of compression processes; and selecting, by the system (e.g., compression selection component 314), a compression process from the group of compression processes, based on an output from a machine learning component that employs a neural network, the statistical attributes, the compression requirement, and a compression objective to determine the compression process.

In some embodiments, the receive component 310 can comprise, but not limited to, one or more electronic devices and processor to generate one or more metadata product. In some embodiments, the receive component 310 receives request to provide the best compression algorithm to employ for compressing a dataset. The request may comprise the dataset, statistical attributes associated with the dataset, and a compression requirement for compression of the dataset. In some embodiments, the statistical attributes may comprise information about the dataset, for example the size of the dataset prior to compression. The statistical attributes may comprise information about use of the dataset (e.g., application, executable image, raw data, etc.). In some embodiments, the receive component 310 further receives one or more compression requirement for how the dataset should be compressed. For example, the compression requirement may comprise maximum or preferred compression size (e.g., maximum size of the compressed dataset), time to compress threshold (e.g., time limit for compressing the dataset), and time to decompress (e.g., time limit for decompressing the dataset).

In some embodiments, the compression estimator component 312, based on the statistical attributes and the compression requirement, facilitates estimating a first compression attribute and a second compression attribute of a group of compression processes. In some embodiments, prior to performing the compression, the compression estimator component 312, may estimate one or more statistical compression attributes that would result in using one or more compression algorithm. For example, the compression estimator component 312 can estimate time for compressing dataset, time for decompressing the dataset and overall storage saving (e.g., first compression attribute) based on compression requirement. The advantage is that user is given an option prior to committing to a specific compression algorithm. For example, when the user provides a very large dataset for compression, the compression estimator component 312 estimates that in order to complete the compression of the given dataset, it may take 1 hour for compression and produce a 30% storage savings (e.g. using first compression algorithm). The compression estimator component 312 may also provide additional compression attributes using different compression algorithm (e.g., compression/decompression time of 30 minutes and 85% storage savings). The advantage is that user can choose which compression algorithm to use based their requirements.

In some embodiments, the compression selection component 314, facilitates selecting a primary compression process from the group of compression processes, based on an output of an analytics component, wherein the analytics component employs a neural network to determine the primary compression process based on analysis of the statistical attributes, the compression requirement, and a compression objective. The compression selection component 314 employs various neural network algorithms to select the primary compression algorithm for recommendation. In some embodiments, the neural network collects all the compression attributes generated by the compression estimator component 312 (e.g., the first compression attribute and second compression attribute) and utilizes the received statistical attribute, compression requirements and requestor's compression objectives (e.g., low compression time or high storage savings or range of values for compression time and storage savings) to provide a recommendation. The advantage of using a neural network is that the user is presented with a best fit recommendation for compression algorithm to use.

Figure 4:
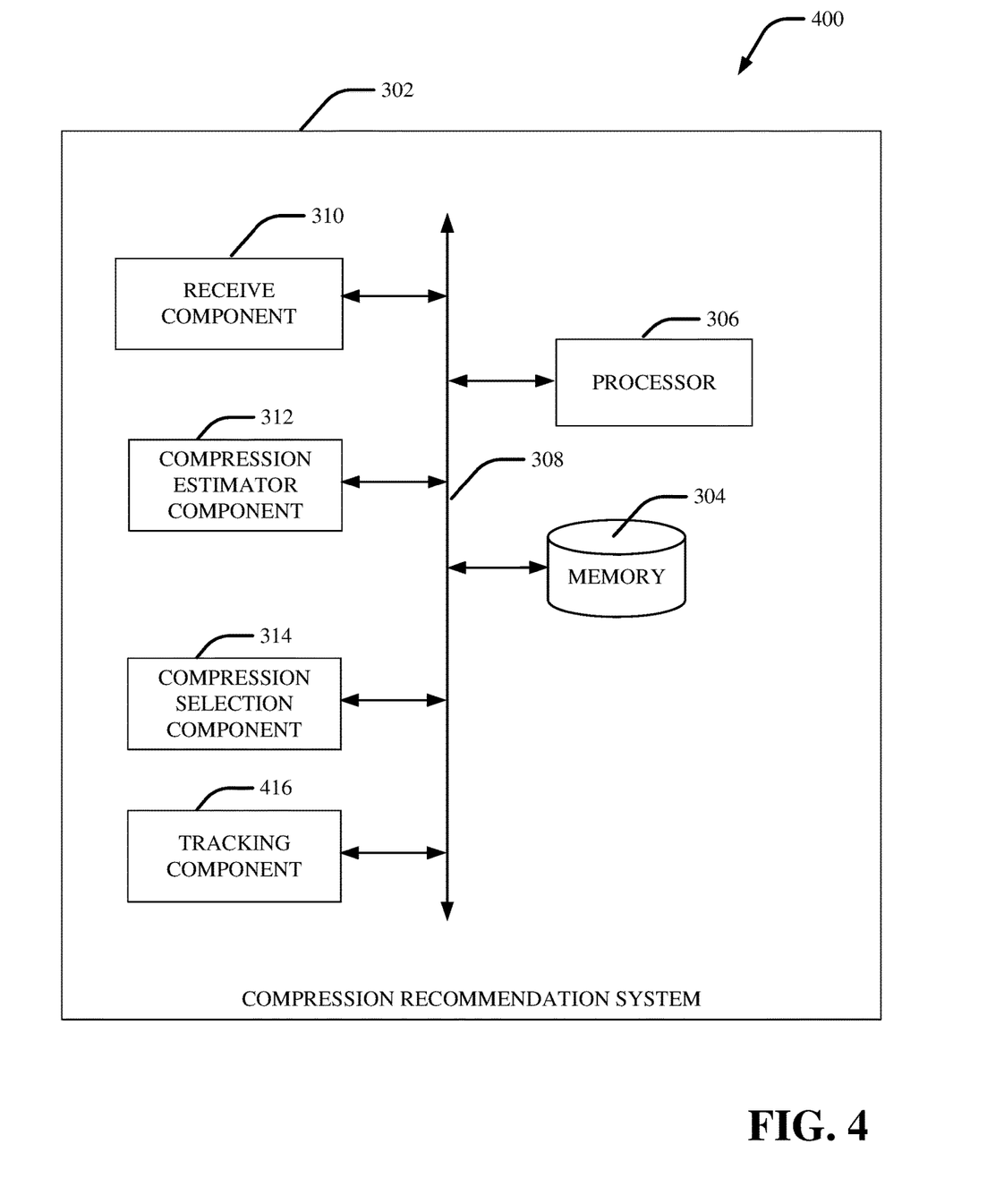
FIG. 4 illustrates a block diagram of an example, non-limiting system that facilitates recommending data compression using machine learning and statistical attributes in accordance with one or more embodiments described herein.

FIG. 4 illustrates a block diagram of an example, non-limiting system 400 that facilitates recommending data compression using machine learning and statistical attributes in accordance with one or more embodiments described herein. Repetitive description of like elements employed in respective embodiments is omitted for sake of brevity. According to several embodiments, the system 400 can comprise compression recommendation system 302. In some embodiments, compression recommendation system 302 can further comprise a tracking component 416.

In some embodiments, the tracking component 416 can comprise one or more sensors, memory, and one or more processors to facilitate securing the communication link and generating commands/messages. In some embodiments, the tracking component 416 facilitates tracking, by the neural network, whether the primary compression process was selected for the compression of the dataset. In some embodiments, the tracking component is communicatively connected to the neural network component (not shown) to track the final selection of the presented compression algorithm. In some embodiments, the neural network component may utilize machine learning techniques to track the user's responses to recommendation (e.g., was the recommendation implemented/selected for compressing the dataset) and make adjustments to the neural network algorithm based on the response.

Figure 5:
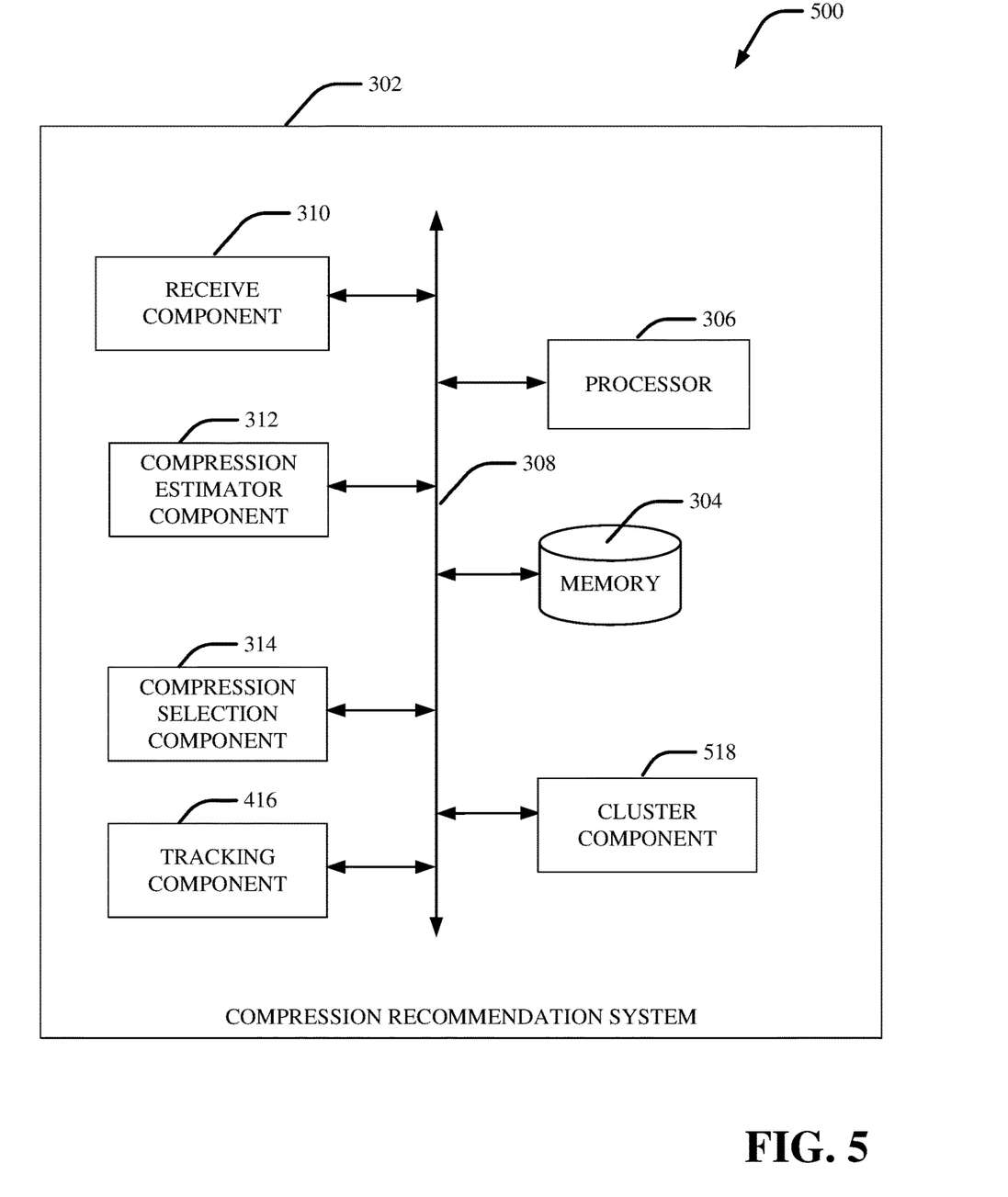
FIG. 5 illustrates a block diagram of an example, non-limiting system that facilitates recommending data compression using machine learning and statistical attributes in accordance with one or more embodiments described herein.

FIG. 5 illustrates a block diagram of an example, non-limiting system 500 that facilitates recommending data compression using machine learning and statistical attributes in accordance with one or more embodiments described herein. Repetitive description of like elements employed in respective embodiments is omitted for sake of brevity. According to several embodiments, the system 400 can comprise compression recommendation system 302. In some embodiments, compression recommendation system 302 can further comprise a cluster component 518.

In some embodiments, the cluster component 518 in response to the dataset being determined to be organized by the clusters of data, determining, by the system, cluster statistical attributes for the clusters of data. In some embodiments, the cluster component 518 determines that the dataset is organized by cluster of data. Clustering of the data should be considered as a preprocessing step to identify randomness in the system and then deduplication or compression can be applied within different cluster to maximize the space saving. Intracultural deduplication or compression would reduce the search space hence would result in faster completion of operations. Cluster identification would imply a faster dedupe pointer updates in case of host writes as well as can be used while compressing the data most of the datasets in a cluster would have similar degree of randomness. Cluster identification can be achieved through locality sensitive hashing, KD trees, k-means considering cryptographic hashes of small data chunks as coordinates. Kolmogorov complexity can also have some influence on degree of compressibility, but results show that already mentioned features perform quite well since problem at interest is to compare compression algorithms rather than precise behavior prediction. In some embodiments, the dataset that is organized by clusters, the cluster component 518 generates a cluster statistical attribute. The cluster statistical attributes may include compression requirement based on each cluster. In some embodiments, each cluster can be compressed separately and independently, wherein each cluster may have separate compression requirements and objectives.

Figure 6:
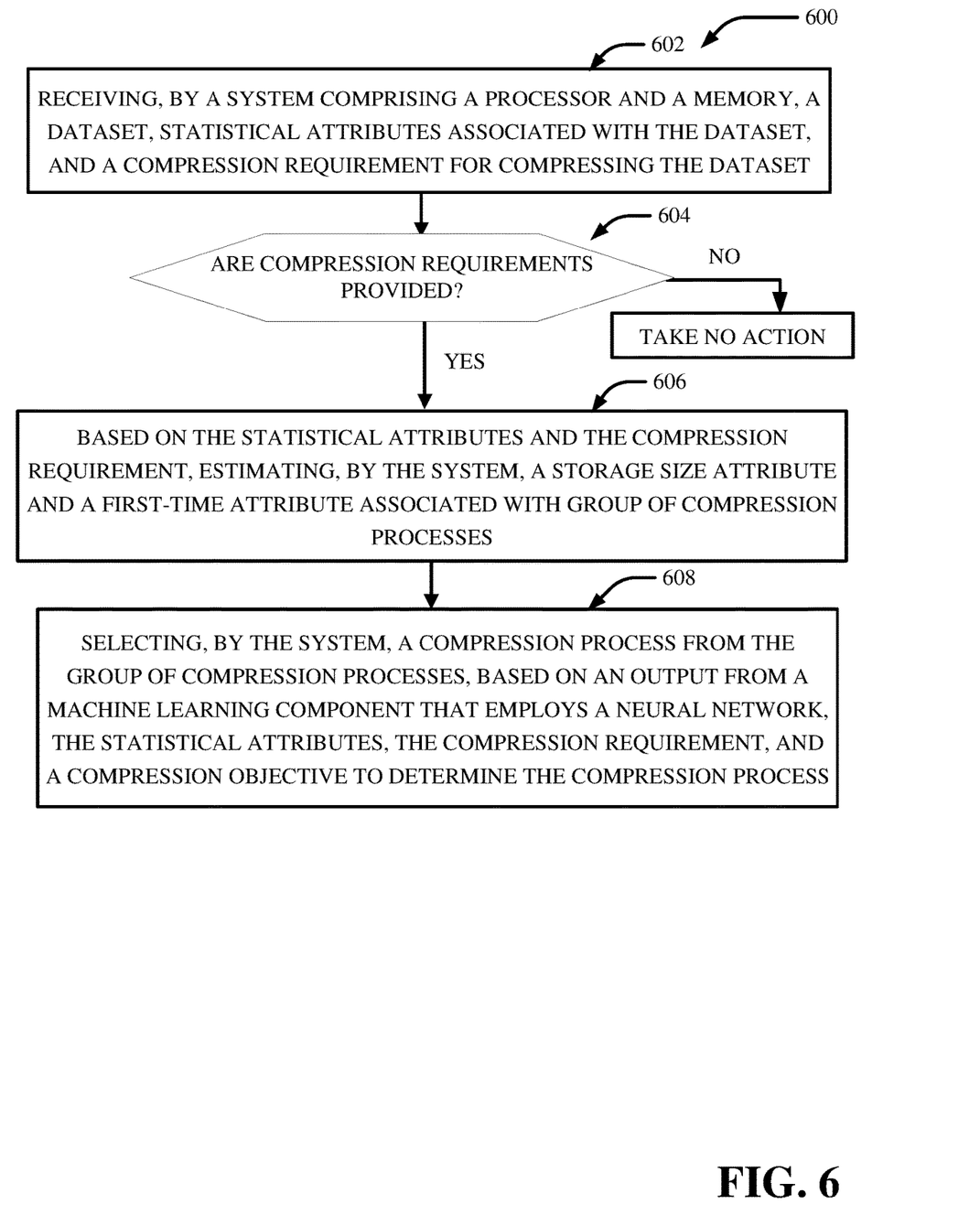
FIG. 6 depicts a diagram of an example, non-limiting computer implemented method that facilitates using the compression recommendation system accordance with one or more embodiments describe herein.
Figure 10:
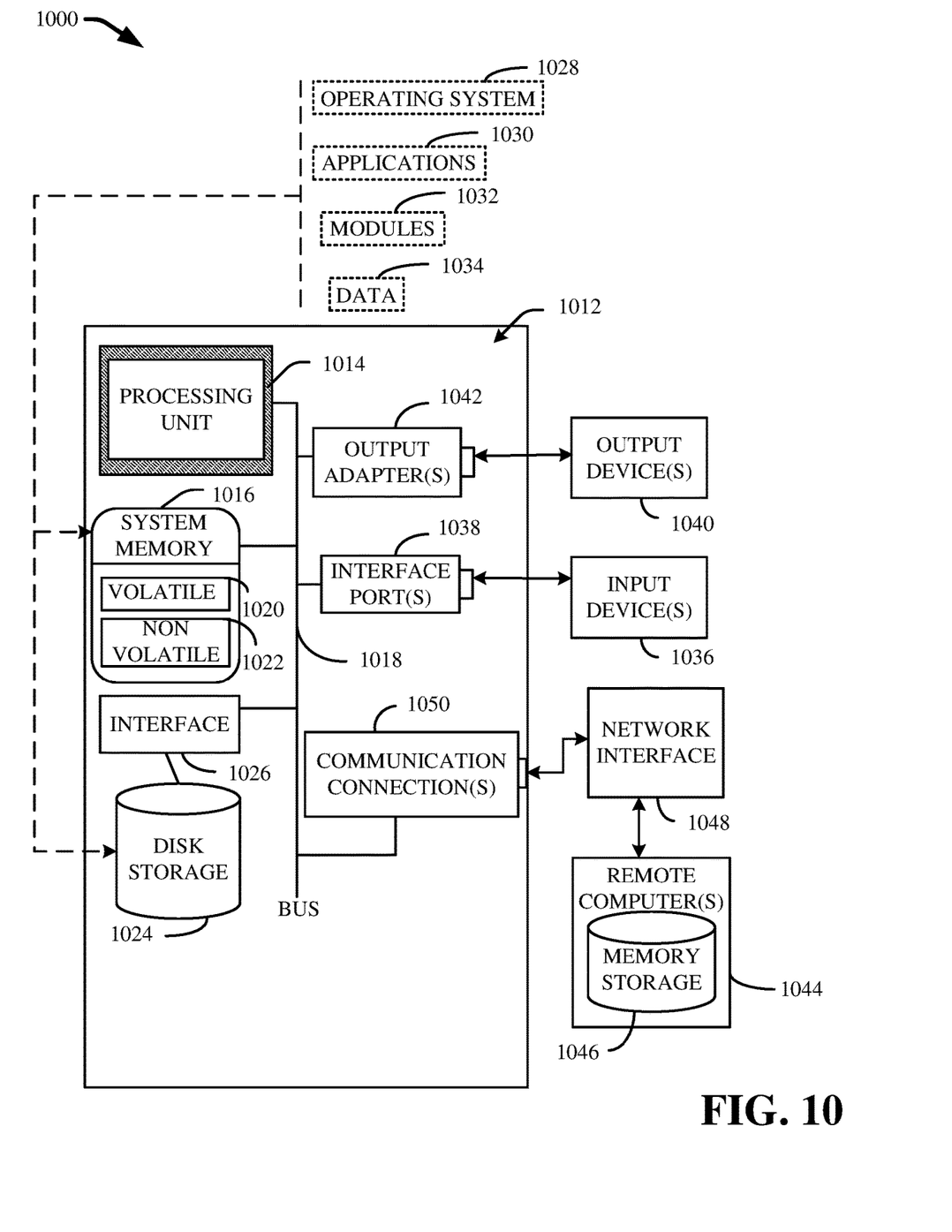
FIG. 10 illustrates a block diagram of an example, non-limiting operating environment in which one or more embodiments described herein can be facilitated.

FIG. 6 depicts a diagram of an example, non-limiting computer implemented method that facilitates using the compression recommendation system 302 accordance with one or more embodiments describe herein. Repetitive description of like elements employed in other embodiments described herein is omitted for sake of brevity. In some examples, flow diagram 600 can be implemented by operating environment 1000 described below. It can be appreciated that the operations of flow diagram 600 can be implemented in a different order than is depicted.

In non-limiting example embodiments, a computing device (or system) (e.g., computer 1012) is provided, the device or system comprising one or more processors and one or more memories that stores executable instructions that, when executed by the one or more processors, can facilitate performance of the operations as described herein, including the non-limiting methods as illustrated in the flow diagrams of FIG. 6.

Operation 602 receiving, by a system comprising a processor and a memory, a dataset, statistical attributes associated with the dataset, and a compression requirement for compressing the dataset. Operation 604 depicts determining if compression requirements were provided. If compression requirements were provided, then perform operation 606. Otherwise, continue monitoring. Operation 606 depicts, based on the statistical attributes and the compression requirement, estimating, by the system, a storage size attribute and a first-time attribute associated with group of compression processes. Operation 608 depicts selecting, by the system, a compression process from the group of compression processes, based on an output from a machine learning component that employs a neural network, the statistical attributes, the compression requirement, and a compression objective to determine the compression process.

Figure 7:
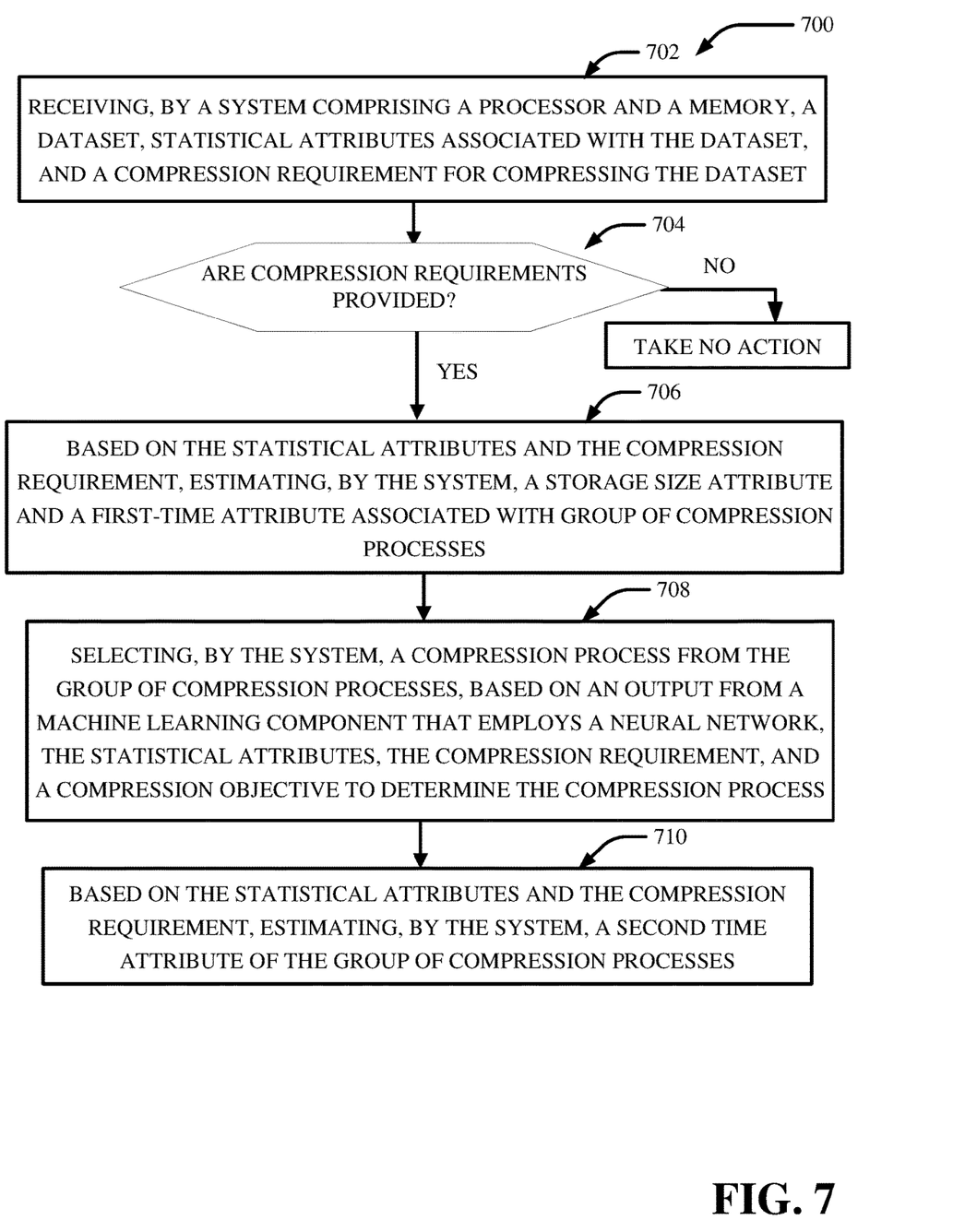
FIG. 7 depicts a diagram of an example, non-limiting computer implemented method that facilitates using the compression recommendation system accordance with one or more embodiments describe herein.

FIG. 7 depicts a diagram of an example, non-limiting computer implemented method that facilitates using the compression recommendation system 302 accordance with one or more embodiments describe herein. Repetitive description of like elements employed in other embodiments described herein is omitted for sake of brevity. In some examples, flow diagram 700 can be implemented by operating environment 1000 described below. It can be appreciated that the operations of flow diagram 700 can be implemented in a different order than is depicted.

In non-limiting example embodiments, a computing device (or system) (e.g., computer 1012) is provided, the device or system comprising one or more processors and one or more memories that stores executable instructions that, when executed by the one or more processors, can facilitate performance of the operations as described herein, including the non-limiting methods as illustrated in the flow diagrams of FIG. 7.

Operation 702 receiving, by a system comprising a processor and a memory, a dataset, statistical attributes associated with the dataset, and a compression requirement for compressing the dataset. Operation 704 depicts determining if compression requirements were provided. If compression requirements were provided, then perform operation 706. Otherwise, continue monitoring. Operation 706 depicts, based on the statistical attributes and the compression requirement, estimating, by the system, a storage size attribute and a first-time attribute associated with group of compression processes. Operation 708 depicts selecting, by the system, a compression process from the group of compression processes, based on an output from a machine learning component that employs a neural network, the statistical attributes, the compression requirement, and a compression objective to determine the compression process. Operation 710 depicts, based on the statistical attributes and the compression requirement, estimating, by the system, a second time attribute of the group of compression processes.

Figure 8:
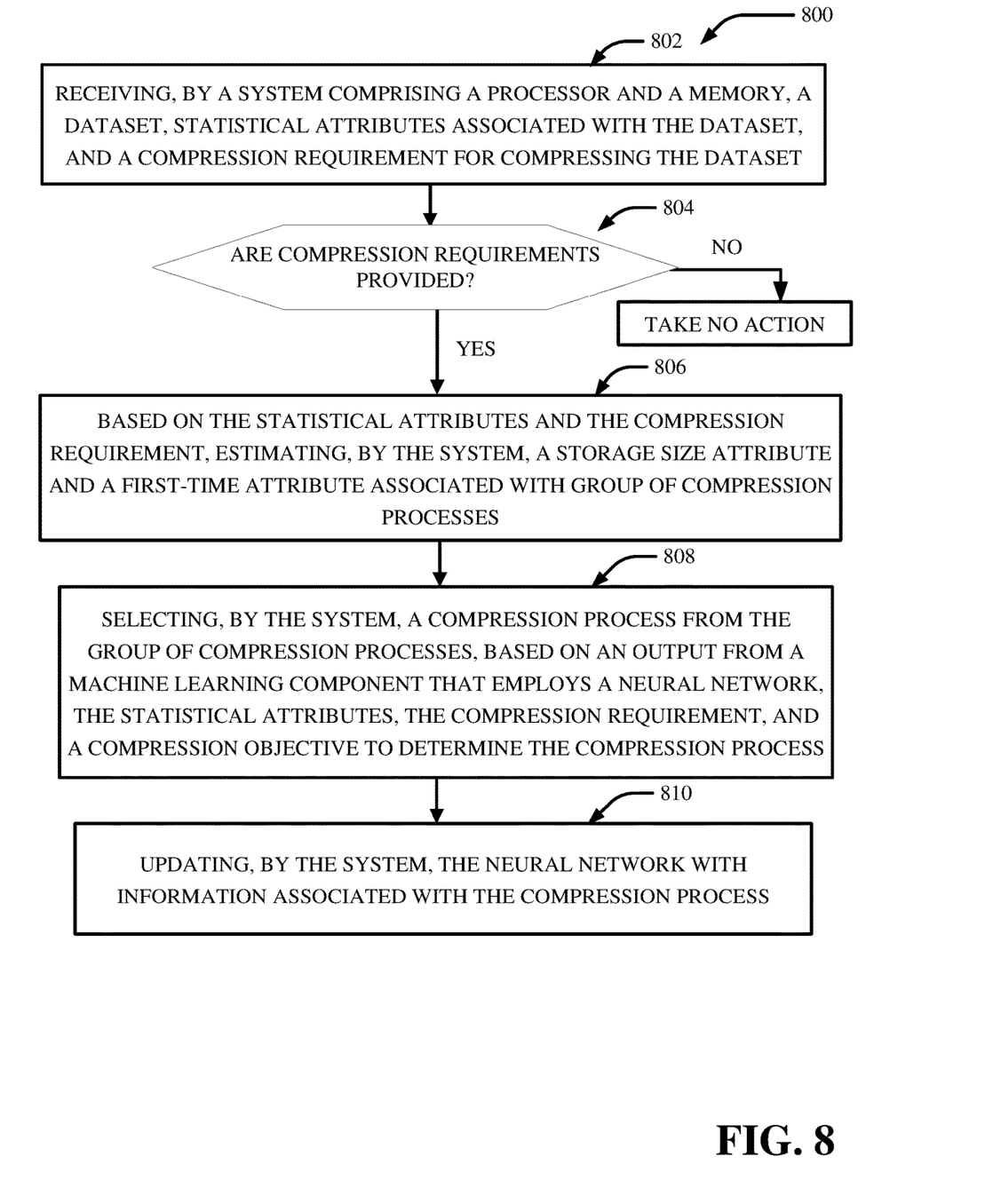
FIG. 8 depicts a diagram of an example, non-limiting computer implemented method that facilitates using the compression recommendation system accordance with one or more embodiments describe herein.

FIG. 8 depicts a diagram of an example, non-limiting computer implemented method that facilitates using the compression recommendation system 302 accordance with one or more embodiments describe herein. Repetitive description of like elements employed in other embodiments described herein is omitted for sake of brevity. In some examples, flow diagram 800 can be implemented by operating environment 1000 described below. It can be appreciated that the operations of flow diagram 800 can be implemented in a different order than is depicted.

In non-limiting example embodiments, a computing device (or system) (e.g., computer 1012) is provided, the device or system comprising one or more processors and one or more memories that stores executable instructions that, when executed by the one or more processors, can facilitate performance of the operations as described herein, including the non-limiting methods as illustrated in the flow diagrams of FIG. 8.

Operation 802 receiving, by a system comprising a processor and a memory, a dataset, statistical attributes associated with the dataset, and a compression requirement for compressing the dataset. Operation 804 depicts determining if compression requirements were provided. If compression requirements were provided, then perform operation 806. Otherwise, continue monitoring. Operation 806 depicts, based on the statistical attributes and the compression requirement, estimating, by the system, a storage size attribute and a first-time attribute associated with group of compression processes. Operation 808 depicts selecting, by the system, a compression process from the group of compression processes, based on an output from a machine learning component that employs a neural network, the statistical attributes, the compression requirement, and a compression objective to determine the compression process. Operation 810 depicts, updating, by the system, the neural network with information associated with the compression process.

Figure 9:
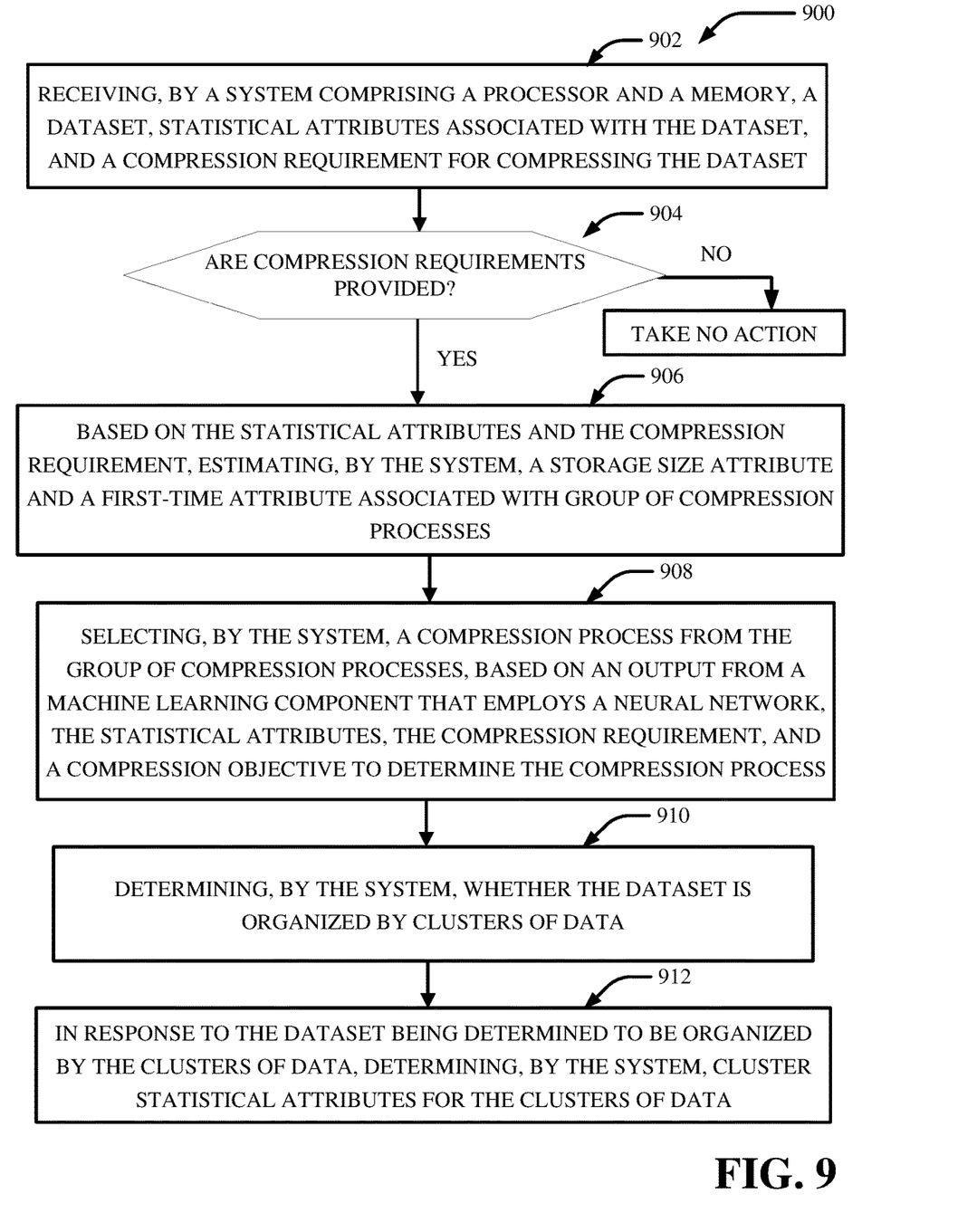
FIG. 9 depicts a diagram of an example, non-limiting computer implemented method that facilitates using the compression recommendation system accordance with one or more embodiments describe herein.

FIG. 9 depicts a diagram of an example, non-limiting computer implemented method that facilitates using the compression recommendation system 302 accordance with one or more embodiments describe herein. Repetitive description of like elements employed in other embodiments described herein is omitted for sake of brevity. In some examples, flow diagram 900 can be implemented by operating environment 1000 described below. It can be appreciated that the operations of flow diagram 900 can be implemented in a different order than is depicted.

In non-limiting example embodiments, a computing device (or system) (e.g., computer 1012) is provided, the device or system comprising one or more processors and one or more memories that stores executable instructions that, when executed by the one or more processors, can facilitate performance of the operations as described herein, including the non-limiting methods as illustrated in the flow diagrams of FIG. 9.

Operation 902 receiving, by a system comprising a processor and a memory, a dataset, statistical attributes associated with the dataset, and a compression requirement for compressing the dataset. Operation 904 depicts determining if compression requirements were provided. If compression requirements were provided, then perform operation 906. Otherwise, continue monitoring. Operation 906 depicts, based on the statistical attributes and the compression requirement, estimating, by the system, a storage size attribute and a first-time attribute associated with group of compression processes. Operation 908 depicts selecting, by the system, a compression process from the group of compression processes, based on an output from a machine learning component that employs a neural network, the statistical attributes, the compression requirement, and a compression objective to determine the compression process. Operation 910 depicts, determining, by the system, whether the dataset is organized by clusters of data. Operation 912 depicts, in response to the dataset being determined to be organized by the clusters of data, determining, by the system, cluster statistical attributes for the clusters of data.

FIG. 10 illustrates a block diagram of an example, non-limiting operating environment 1000 in which one or more embodiments described herein can be facilitated. The operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1094), and Small Computer Systems Interface (SCSI). The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 1020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1001. Such software can also include, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all the elements described relative to computer 1012. For purposes of brevity, only a memory storage device 1046 is illustrated with remote computer(s) 1044. Remote computer(s) 1044 is logically coupled to computer 1012 through a network interface 1048 and then physically coupled via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

Embodiments of the present innovation may be a system, a method, an apparatus and/or a computer program product at any possible technical detail level of integration. The computer program product can include a computer readable storage medium (or media) having computer readable program instructions thereon for causing a processor to carry out aspects of the present innovation. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present innovation can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be coupled to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, to perform aspects of the present innovation.

Aspects of the present innovation are described herein with reference to flowchart illustrations and/or block diagrams of methods, apparatus (systems), and computer program products according to embodiments of the innovation. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present innovation. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform tasks and/or implement abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a server computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products, and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A system, comprising:
a processor; and
a memory that stores executable instructions that, when executed by the processor, facilitate performance of operations, comprising:
receiving a dataset, statistical attributes associated with the dataset, and a compression requirement for compression of the dataset, wherein the compression requirement comprises a storage size requirement, a first time requirement and a second time requirement, wherein the first time requirement comprises a first length of time required to compress the dataset, and wherein the second time requirement comprises a second length of time required to decompress a compressed dataset;

based on the statistical attributes and the compression requirement, estimating a first compression attribute and a second compression attribute of a group of compression processes; and selecting a primary compression process from the group of compression processes, based on an output of an analytics component, wherein the analytics component employs a neural network to determine the primary compression process based on analysis of the statistical attributes, the compression requirement, and a compression objective.

2. The system of claim 1, wherein the first compression attribute comprises an estimated storage size of the dataset as a result of being compressed employing a compression process of the group of compression processes.

3. The system of claim 1, wherein the second compression attribute comprises an estimated time to compress the dataset as a result of being compressed employing a compression process of the group of compression processes.

4. The system of claim 1, wherein the operations further comprise:

based on the statistical attributes and the compression requirement, estimating a third compression attribute of the group of compression processes.

5. The system of claim 4, wherein the third compression attribute comprises an estimated time to decompress the dataset as a result of being compressed employing a compression process of the group of compression processes.

6. The system of claim 1, wherein the statistical attributes comprise a type of data in the dataset and a size of the data in the dataset.

7. The system of claim 1, wherein the operations further comprise:

tracking, by the neural network, whether the primary compression process was selected for the compression of the dataset.

8. The system of claim 1, wherein the operations further comprise:

determining whether the dataset is organized by clusters of data.

9. A method, comprising:

receiving, by a system comprising a processor and a memory, a dataset, statistical attributes associated with the dataset, and a compression requirement for compressing the dataset, wherein the compression requirement comprises a storage size requirement, a first time requirement to compress and a second time requirement to decompress;

based on the statistical attributes and the compression requirement, estimating, by the system, a storage size attribute and a first time attribute associated with a group of compression processes; and selecting, by the system, a compression process from the group of compression processes, based on an output from a machine learning component that employs a neural network, the statistical attributes, the compression requirement, and a compression objective to determine the compression process.

10. The method of claim 9, wherein the storage size attribute comprises an estimated storage size of the dataset that would result under circumstances of being compressed by employing the compression process.

11. The method of claim 9, further comprising:

based on the statistical attributes and the compression requirement, estimating, by the system, a second time attribute of the group of compression processes.

12. The method of claim 9, further comprising:

updating, by the system, the neural network with information associated with the compression process.

13. The method of claim 9, further comprising:

determining, by the system, whether the dataset is organized according to clusters of data; and in response to the dataset being determined to be organized according to the clusters of data, determining, by the system, cluster statistical attributes for the clusters of data.

14. The method of claim 9, wherein the second time requirement comprises a second length of time required to decompress a compressed dataset.

15. A machine-readable storage medium, comprising executable instructions that, when executed by a processor, facilitate performance of operations, comprising:

receiving a dataset, statistical attributes associated with the dataset, and a compression requirement for compression of the dataset;

based on the statistical attributes and the compression requirement, estimating a first compression attribute, a second compression attribute associated with a plurality of compression algorithms and a third compression attribute;

selecting a primary compression algorithm from the plurality of compression algorithms, based on an output of an analytics component, wherein the analytics component employs a neural network to determine the primary compression algorithm based on analysis of the statistical attributes, the compression requirement, and a compression objective; and based on the statistical attributes and the compression requirement, estimating a second time attribute associated with the plurality of compression algorithms.

16. The machine-readable storage medium of claim 15, wherein the operations further comprise:

in response to determining that the dataset is organized across clusters of data, determining cluster statistical attributes for the clusters of data.

17. The machine-readable storage medium of claim 15, wherein the compression requirement comprises a storage size requirement, a compression time requirement and a decompression time requirement, and wherein a storage size attribute comprises an estimated storage size of the dataset that would result from compression employing the primary compression algorithm.

18. The machine-readable storage medium of claim 17, wherein the storage size attribute comprises an estimated storage size of the dataset that would result under circumstances of being compressed by employing the compression process.

19. The machine-readable storage medium of claim 15, wherein the operations further comprise:

updating the neural network with information associated with the primary compression algorithm.

20. The machine-readable storage medium of claim 15, wherein the third compression attribute comprises an estimated time to decompress the dataset as a result of being compressed employing a compression process of the group of compression processes.

* * * * *